(12) United States Patent
Wei et al.

(10) Patent No.: US 11,309,184 B2
(45) Date of Patent: Apr. 19, 2022

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Wang Wei, Shanghai (CN); Su Bo, Shanghai (CN); Sun Linlin, Shanghai (CN); He Qiyang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 113 days.

(21) Appl. No.: 16/863,289

(22) Filed: Apr. 30, 2020

(65) Prior Publication Data

US 2021/0166943 A1 Jun. 3, 2021

(30) Foreign Application Priority Data

Nov. 29, 2019 (CN) .......................... 201911203882.0

(51) Int. Cl.
*H01L 21/033* (2006.01)
*H01L 21/768* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/76816* (2013.01); *H01L 21/76877* (2013.01)

(58) Field of Classification Search
CPC .................... H01L 21/76816; H01L 21/76877
See application file for complete search history.

(56) References Cited

U.S. PATENT DOCUMENTS

2019/0172748 A1* 6/2019 Clevenger ......... H01L 21/76837

* cited by examiner

*Primary Examiner* — Walter H Swanson
(74) *Attorney, Agent, or Firm* — Crowell & Moring LLP (57) ABSTRACT

A semiconductor structure and a formation method thereof are disclosed. The formation method includes: providing a base, wherein a first mandrel layer and a first mask layer located on the first mandrel layer are formed on the base, and openings exposing the first mandrel layer are formed in the first mask layer; forming a second mandrel layer covering the first mask layer, wherein the second mandrel layer also fills the openings; forming first trenches running through the second mandrel layer, the first mask layer and the first mandrel layer, wherein the side walls of the first trenches expose the second mandrel layer in the openings; forming side wall layers on the side walls of the first trenches; and etching to remove the second mandrel layer and the first mandrel layer below the positions of the openings by taking the side wall layers as masks to form second trenches running through the first mandrel layer, wherein the second trenches and the first trenches are isolated by the side wall layers. The present disclosure enlarges a process window for forming the second trenches under the protective effect of the first mask layer.

12 Claims, 9 Drawing Sheets

SEMICONDUCTOR STRUCTURE AND FORMATION METHOD THEREOF

RELATED APPLICATIONS

The present application claims priority to Chinese Patent Appln. No. 201911203882.0, filed Nov. 29, 2019, the entire disclosure of which is hereby incorporated by reference.

BACKGROUND

Technical Field

Embodiments and implementations of the present disclosure relate to the field of semiconductor manufacturing, and, in particular, to a semiconductor structure and a formation method thereof.

Related Art

With the rapid growth of the semiconductor integrated circuit (IC) industry, semiconductor technology continues to move towards smaller process nodes under the drive of the Moore's Law. As smaller ICs are developed, circuits with a higher precision and complexity are also developed. During the development of the ICs, usually when a functional density (that is, the number of intraconnection structures per chip) is gradually increased, and a geometric size (that is, the smallest element size that can be produced by using process steps) is gradually decreased, which increases the difficulty and complexity of IC manufacturing.

How to improve an accuracy of pattern transfer in IC manufacturing has become a challenge when technology nodes are constantly shrinking.

SUMMARY

Embodiments and implementations of the present disclosure provide a semiconductor structure and a formation method thereof to address these problems, so as to enlarge a process window for pattern transfer.

To address these problems, embodiments and implementations of the present disclosure provide a formation method of a semiconductor structure. In one form, a method includes: providing a base, wherein a first mandrel layer and a first mask layer located on the first mandrel layer are formed on the base, and openings exposing the first mandrel layer are formed in the first mask layer; forming a second mandrel layer covering the first mask layer, wherein the second mandrel layer also fills the openings; forming first trenches running through the second mandrel layer, the first mask layer and the first mandrel layer, wherein the side walls of the first trenches expose the second mandrel layer in the openings; forming side wall layers on the side walls of the first trenches; and etching to remove the second mandrel layer and the first mandrel layer below the openings by taking the side wall layers as masks to form second trenches running through the first mandrel layer, wherein the second trenches and the first trenches are isolated by the side wall layers.

Embodiments and implementations of the present disclosure further provide a semiconductor structure. In one form, a semiconductor structure includes: a base; a first mandrel layer, located on the base; a first mask layer, located on the first mandrel layer and internally having openings running through the first mask layer; a second mandrel layer, covering the first mask layer and filling the openings; first trenches, running through the second mandrel layer, the first mask layer and the first mandrel layer; and side wall layers, located on the side walls of the first trenches and covering a side wall, facing the first trenches, of the second mandrel layer in the openings.

Compared with the prior art, technical solutions of embodiments and implementations of the present disclosure have the following advantages:

In embodiments and implementations of the present disclosure, after the first mask layer having the openings is formed on the first mandrel layer, the second mandrel layer covering the first mask layer is formed, and also fills the openings. The first mask layer is configured to play a role of protecting the first mandrel layer, and the openings are configured to define the shapes and positions of the subsequent second trenches. After the second mandrel layer and the first mandrel layer located below the openings are etched to be removed in the subsequent process to form the second trenches running through the first mandrel layer, the first mandrel layer below the first mask layer can be retained, so that the second trenches and the first trenches are isolated by the side wall layers. Compared with a solution for defining the positions of the second trenches by using masks, this technical solution enlarges a process window for forming the second trenches under the protective effect of the first mask layer, thus enlarging a process window for pattern transfer, and then is favorable for improving the accuracy of pattern transfer.

DETAILED DESCRIPTION

It can be seen from the background that how to improve the accuracy of pattern transfer has become a challenge when technology nodes are constantly shrinking, resulting in that a process window for the pattern transfer is smaller and smaller.

To address the technical problems, embodiments and implementations of the present disclosure provides a formation method of a semiconductor structure, including that: a base is provided, wherein a first mandrel layer and a first mask layer located on the first mandrel layer are formed on the base, and openings exposing the first mandrel layer are formed in the first mask layer; a second mandrel layer covering the first mask layer is formed, wherein the second mandrel layer also fills the openings; first trenches running through the second mandrel layer, the first mask layer and the first mandrel layer are formed, wherein the side walls of the first trenches expose the second mandrel layer in the openings; side wall layers are formed on the side walls of the first trenches; and the second mandrel layer and the first mandrel layer below the positions of the openings are etched to be removed by taking the side wall layers as masks to form second trenches running through the first mandrel layer, wherein the second trenches and the first trenches are isolated by the side wall layers. In embodiments and implementations of the present disclosure, after the second mandrel layer and the first mandrel layer below the positions of the openings are etched to be removed to form the second trenches running through the first mandrel layer, the first mandrel layer below the first mask layer is retained, so that the second trenches and the first trenches are isolated by the side wall layers. Compared with a solution for defining the positions of the second trenches by using masks, this technical solution enlarges a process window for forming the second trenches under the protective effect of the first mask layer, thus enlarging a process window for pattern transfer, thereby favorably improving the accuracy of the pattern transfer.

To make the objectives, features and advantages of the embodiments and implementations of the present disclosure more comprehensible, specific embodiments and implementations of the present disclosure are described in detail below with reference to the accompanying drawings.

FIG. 1 to FIG. 21 are schematic structural diagrams corresponding to steps in one form of a formation method of a semiconductor structure.

Figure 1:
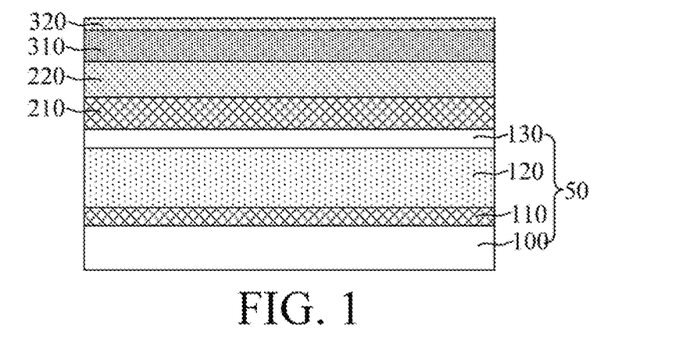
FIG. 1 to FIG. 21 are schematic structural diagrams corresponding to various steps in one form of a method for forming a semiconductor structure.

Referring to FIG. 1, a base 50 is provided, with a first mandrel layer 310 on base 50 and a first mask layer 320 on the first mandrel layer 310.

The base 50 is configured to provide a process platform for subsequent processes. In some implementations, application of a method of forming a semiconductor structure to a back end of line (BEOL) process in a semiconductor process is taken as an example. The base 50 includes a substrate 100 and a dielectric layer 120 located on the substrate 100. A plurality of conductive structures (not shown) are formed in the substrate 100.

The dielectric layer 120 is configured to realize electric isolation between interconnection structures in the BEOL process. For example, the dielectric layer 120 may be a first metal interlayer dielectric layer configured to realize the electric isolation between first metal interconnection lines (i.e., M1 layer). The first metal interconnection lines refer to interconnection structures closest to the substrate 100. In some implementations, in order to reduce a parasitic capacitance between the interconnection structures and thus reduce an RC delay, a material of the dielectric layer 110 is a low-k dielectric material (which refers to a dielectric material having a relative dielectric constant more than or equal to 2.6 and less than or equal to 3.9) or an ultra-low-k dielectric material (which refers to a dielectric material having a relative dielectric constant less than 2.6).

In some implementations, the base 50 further includes a protective layer 130 located on the surface of the dielectric layer 120. The protective layer 130 is configured to protect the dielectric layer 120, thus reducing damage of various processes to the dielectric layer 120 before etching of the dielectric layer 120. For example, when a film layer above the dielectric layer 120 is subsequently etched, the surface of the protective layer 130 is configured to define a position for stopping the etching. In some implementations, a material of the protective layer 130 is silicon oxide.

The base 50 further includes an etching stop layer 110 located between the substrate 100 and the dielectric layer 120. A material of the etching stop layer 110 is different from that of the dielectric layer 120. The material of the etching stop layer 110 may be SiCN, SiC, SiN or BN. When the dielectric layer 120 is subsequently etched to form interconnection openings, the surface of the etching stop layer 110 is configured to define a stop position of the etching process to avoid an etching damage caused by the etching process to the conductive structures, and conductive materials in the conductive structures may be prevented from diffusing into the dielectric layer 120.

After the first mandrel layer 310 is subsequently patterned, the patterned first mandrel layer 310 is configured to provide a support to the subsequently formed side wall layers. The first mandrel layer 310 will also be removed later, so a material of the first mandrel layer 310 is a material that may be easily removed, and a process of removing the first mandrel layer 310 causes a small damage to a film layer below it. In some implementations, the material of the first mandrel layer 310 is amorphous silicon. In other implementations, the material of the first mandrel layer may also be amorphous carbon. In some implementations, the first mandrel layer 310 is formed by a chemical vapor deposition process. In other implementations, the first mandrel layer may be also formed by an atomic layer deposition process.

The first mask layer 320 is configured to protect the first mandrel layer 310. For this reason, the material of the first mask layer 320 is different from the material of the first mandrel layer 310. The material of the first mask layer 320 may be silicon oxide, silicon nitride, silicon oxynitride, or silicon carbonitride. The material of the first mandrel layer 310 and the material of the first mask layer 320 have a high etching selection ratio. In some implementations, the material of the first mask layer 320 is silicon oxide. In some implementations, the first mask layer 320 is formed by the chemical vapor deposition process. In other implementations, the first mask layer may be formed by an atomic layer deposition process.

The thickness of the first mask layer 320 should not be too small or too large. If the thickness of the first mask layer 320 is too small, the first mask layer 320 is easily removed prematurely in the subsequent etching process, thereby reducing the protective effect of the first mask layer 320 on the first mandrel layer 310. If the thickness of the first mask layer 320 is too large, the difficulty of the processes of subsequent etching of the first mask layer 320 and the removal of the first mask layer 320 will be correspondingly increased, and waste of the process cost and the process time may also be caused. For this reason, in some implementations, the thickness of the first mask layer 320 is 100 Å to 1000 Å, for example, 300 Å, 500 Å, 700 Å, and 900 Å.

In some implementations, in order to improve the accuracy of the pattern transfer and thus improve the morphology of the interconnection openings subsequently formed in the dielectric layer 120, a second mask layer 210 and a third mask layer 220 located on the second mask layer 210 are further formed between the base 50 and the first mandrel layer 310, and the etching resistance of the second mask layer 210 is greater than that of the third mask layer 220. When the third mask layer 220 is subsequently etched, the second mask layer 210 is configured to function as the etching stop layer, thereby improving the process window and contour control of the etching process. A material of the second mask layer 210 is a nitrogen-containing dielectric material, thereby enhancing the etching resistance of the second mask layer 210. In some implementations, the material of the second mask layer 210 is silicon nitride.

Subsequently, by forming first mask openings in the third mask layer 220, a pattern of the first mask openings is further transferred into the second mask layer 210, and then is transferred into the base 50 through the patterned second mask layer 210. In some implementations, the material of the third mask layer 220 is silicon oxide. The silicon oxide and the silicon nitride have a high etching selection ratio, and the amorphous silicon and the silicon oxide also have a high etching selection ratio.

In some implementations, the materials of the first mask layer 320 and the third mask layer 220 are the same. When the third mask layer 220 is subsequently etched, the first mask layer 320 is exposed to an etching environment, and may be removed during the etching of the third mask layer 220, so that the step that the first mask layer 320 is removed is correspondingly omitted, which simplifies the process steps.

Figure 5:
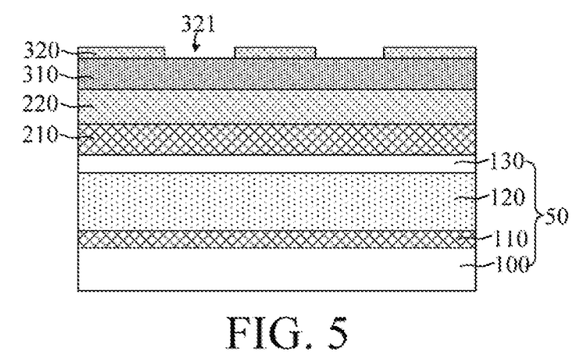

Referring to FIG. 5, openings 321 exposing the first mandrel layer 310 are formed in the first mask layer 320.

The openings 321 are configured to define positions, shapes and dimensions of second trenches subsequently formed in the first mandrel layer 310, thereby defining the shapes, dimensions and positions of the interconnection openings formed in the dielectric layer 120. Under the protective effect of the first mask layer 320, when the first mandrel layer 310 below the positions of the openings 321 is subsequently etched, the first mandrel layer 310 below the first mask layer 320 may be retained, so that the second trenches are formed in the mandrel layer 310.

Figure 4:
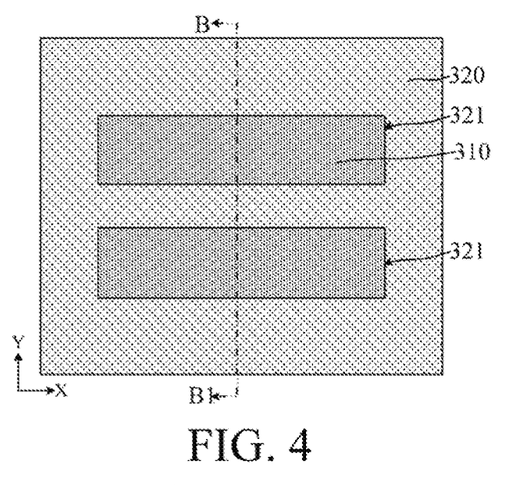

In some implementations, an extending direction of each opening 321 is a first direction (as shown in an X direction in FIG. 4), and a direction perpendicular to the first direction is a second direction (as shown in a Y direction in FIG. 4). A plurality of openings 321 is provided, and is arranged in parallel in the second direction.

The step that the openings 321 are formed is described specifically below with reference to FIG. 2 to FIG. 5.

Figure 2:
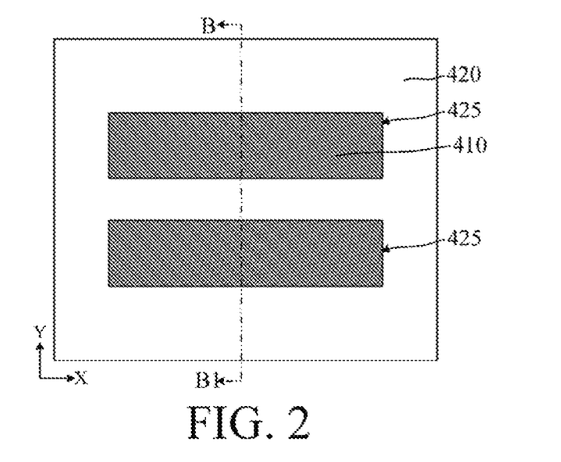
Figure 3:
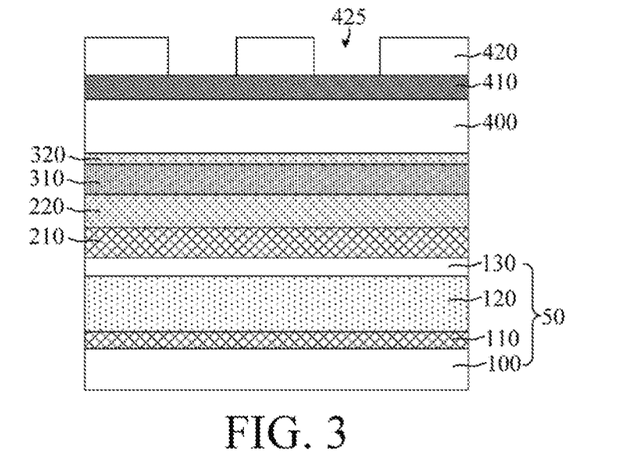

As shown in FIG. 2 and FIG. 3, FIG. 2 is a top view, and FIG. 3 is a cross-sectional view along a cut line BB1 of FIG. 2. A first pattern layer 420 is formed on the first mask layer 320, and first grooves 425 are formed in the first pattern layer 420.

The first grooves 425 are configured to define to-be-etched regions in the first mask layer 320, thereby defining the shapes, dimensions and positions of part of the interconnection openings formed in the dielectric layer 120. In some implementations, the first grooves 425 extend in the first direction (as described in the X direction in FIG. 2), and are arranged in parallel in the second direction (as described in the Y direction in FIG. 2).

In some implementations, a material of the first pattern layer 420 is a photoresist. In order to improve the morphology of the first grooves 425, before the first pattern layer 420 is formed, the method further includes that: a first planarization layer 400 is formed on the first mask layer 320; and a first anti-reflection coating layer 410 is formed on the first planarization layer 400.

In some implementations, a material of the first planarization layer 400 is a spin on carbon (SOC) material. In other implementations, the material of the first planarization layer may also be an organic dielectric layer (ODL) material or a deep UV light absorbing oxide (DUO) material.

In some implementations, the first anti-reflection coating layer 410 is a Si-ARC layer which is conductive to improving the exposure uniformity and ensuring the accuracy of the pattern transfer.

As shown in FIG. 4 and FIG. 5, FIG. 4 is a top view based on FIG. 2, and FIG. 5 is a cross-sectional view along the cut line BB1 of FIG. 4. The first anti-reflection layer 410, the first planarization layer 400 and the first mask layer 320 are etched in sequence along the first grooves 425 (as shown in FIG. 3) by taking the first pattern layer 420 (as shown in FIG. 3) as a mask, and the openings 321 are formed in the first mask layer 320.

In some implementations, the first mask layer 320 is etched by a dry etching process to form the openings 321. For example, an anisotropic dry etching process is used. The anisotropic dry etching process has anisotropic etching characteristics, which is conducive to improving the morphological quality of the openings 321, so that the dimensions and formation positions of the openings 321 may meet the process requirements. After the openings 321 are formed, the method further includes that: the first pattern layer 420, the first anti-reflection coating layer 410 and the first planarization layer 400 are removed.

It should be noted that in the above-mentioned patterning process, only the openings 321 are formed, and this improves process windows of a photolithography process and the etching process.

Figure 6:
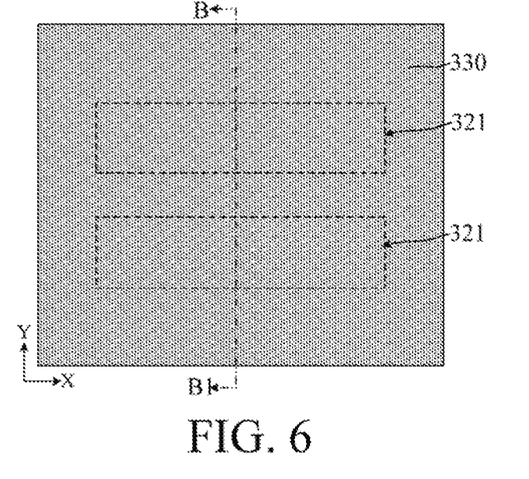
Figure 7:
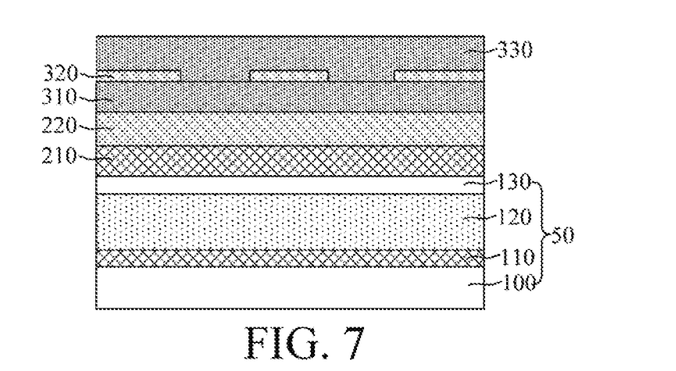

Referring to FIG. 6 and FIG. 7, FIG. 6 is a top view based on FIG. 4, and FIG. 7 is a cross-sectional view along the cut line BB1 of FIG. 6. The second mandrel layer 330 covering the first mask layer 320 is formed, and also fills the openings 321 (as shown in FIG. 6). For ease of illustration, the dotted frames in FIG. 6 are configured to indicate the outlines of the openings 321.

After the second mandrel layer 330 is subsequently patterned, the patterned second mandrel layer 330 is also configured to provide a support to the subsequently formed side wall layers.

It should be noted that the subsequent processes further include a step that the second mandrel layer 330, the first mask layer 320 and the first mandrel layer 310 are etched in sequence, and a step that the second mandrel layer 330 is etched to be removed. When the second mandrel layer 330 is etched, the material of the second mandrel layer 330 and the material of the first mask layer 320 have a high etching selection ratio, thereby reducing the loss of the process of etching the second mandrel layer 330 to the first mask layer 320, so as to ensure the protective effect of the patterned first mask layer 320 on the first mandrel layer 310. In some implementations, when the second mandrel layer 330 is etched, the etching selection ratio of the second mandrel layer 330 to the first mask layer 320 is more than or equal to 2:1. Specifically, the material of the second mandrel layer 330 is different from the material the first mask layer 320. In addition, the second mandrel layer 330 will be removed later, so the material of the second mandrel layer 330 is a material that may be easily removed.

In some implementations, the material of the second mandrel layer 330 is amorphous silicon, and the materials of the second mandrel layer 330 and the first mandrel layer 310 are the same. When the second mandrel layer 330, the first mask layer 320 and the first mandrel layer 310 are etched in sequence subsequently, the second mandrel layer 330 and the first mandrel layer 310 are conveniently etched by using the same process conditions, which is conductive to reducing the complexity of the process. In some implementations, the material of the second mandrel layer may also be amorphous carbon.

In some implementations, the second mandrel layer 330 is formed using the chemical deposition process. By the use of the chemical deposition process, it is easy for the second mandrel layer 330 to fill the openings 321, and the second mandrel layer 330 has a high surface plainness, thereby improving the accuracy of the subsequent pattern transfer.

The subsequent processes further include that: first trenches running through the second mandrel layer 330, the first mask layer 320 and the first mandrel layer 310 are formed. In some implementations, the second mandrel layer 330 covers the first mask layer 320. When the first trenches are formed, the second mandrel layer 330 may also play a role of protecting the first mask layer 320, so as to reduce the probability of damage to the first mask layer 320, thereby guaranteeing the function of the first mask layer 320.

Figure 10:
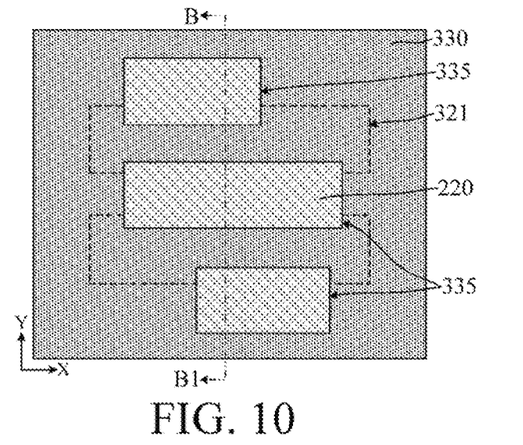
Figure 11:
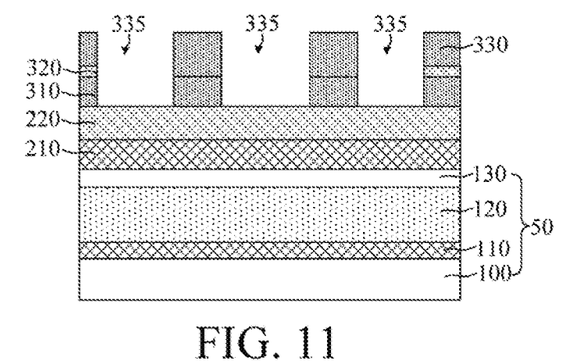

Referring to FIG. 11, the first trenches 335 running through the second mandrel layer 330, the first mask layer 320 and the first mandrel layer 310 are formed, and the side walls of the first trenches 335 expose the second mandrel layer 330 in the openings 321 (as shown in FIG. 10).

The first trenches 335 are configured to define partial to-be-etched regions in the third mask layer 220. The first trenches 335 are also configured to provide spaces for the formation of the side wall layers. The subsequent processes also include that: the side wall layers are formed on the side walls of the first trenches 335; and the second mandrel layer 330 and the first mandrel layer 310 below the positions of the openings 321 are etched to be removed by taking the side wall layers as masks to form second trenches running through the first mandrel layer 310 and enable the second trenches and the first trenches 335 to be isolated by the side wall layers. The second trenches are also configured to define partial to-be-etched regions in the third mask layer 220. The interconnection openings are formed in the dielectric layer 120 by transferring the patterns of the first trenches 335 and the second trenches into the base 50.

In some implementations, there is a plurality of first trenches 335 arranged in parallel in the second direction (as shown in the Y direction in FIG. 10). Specifically, in the second direction, the first trenches 335 are located on both sides of the openings 321, and projections of the first trenches 335 and projections of the openings 321 on the base 50 partially overlap each other to meet the requirement of the design complexity of an IC. In some implementations, according to the design requirements of the IC, in the second direction, the projections of the first trenches and the projections of the openings on the base are adjacent to each other, that is, in the second direction, the side walls of the first trenches are flush with the side walls of the adjacent openings.

The step that the first trenches 335 are formed is described specifically below with reference to FIG. 8 to FIG. 11. For ease of illustration, the dotted frames in FIG. 8 and FIG. 10 are configured to indicate the outlines of the openings 321.

Figure 8:
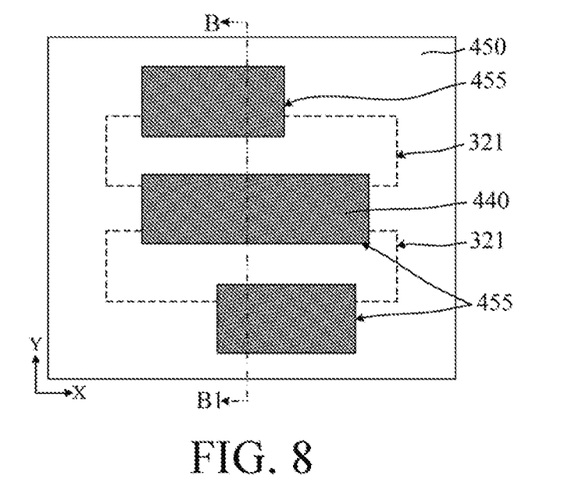
Figure 9:
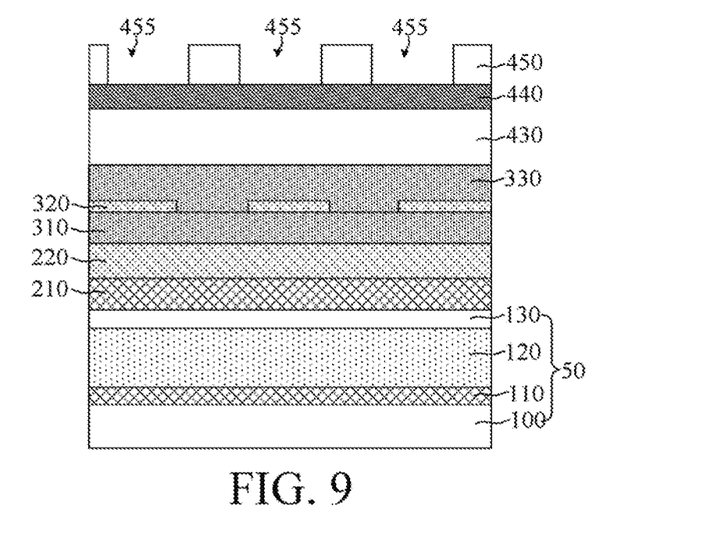

Referring to FIG. 8 and FIG. 9, FIG. 8 is a top view based on FIG. 6, and FIG. 9 is a cross-sectional view along the cut line BB1 of FIG. 8. A second pattern layer 450 is formed on the second mandrel layer 330, and second grooves 455 are formed in the second pattern layer 450. The second grooves 455 extend in the first direction (as shown in the X direction in FIG. 8). In the second direction, projections of the second grooves 455 and the projections of the openings 321 on the base partially overlap each other.

The second grooves 455 are configured to define the shapes, dimensions and formation positions of the first grooves. In some implementations, there is a plurality of second grooves 455 arranged in parallel in the second direction (as shown in the Y direction in FIG. 8).

In some implementations, a material of the second pattern layer 450 is a photoresist. In order to improve the morphology of the second grooves 455, before the second pattern layer 450 is formed, the method further includes that: a second planarization layer 430 is formed on the second mandrel layer 330; and a second anti-reflection coating layer 440 is formed on the second planarization layer 430. In some implementations, a material of the second planarization layer 430 is an SOC material, and the second anti-reflection coating 440 is a Si-ARC layer.

In some implementations, in the second direction, the projections of the second grooves and the projections of the openings on the base are adjacent to each other, that is, in the second direction, the side walls of the second grooves are flush with the side walls of the adjacent openings.

Referring to FIG. 10 and FIG. 11, FIG. 10 is a top view based on FIG. 8, and FIG. 11 is a cross-sectional view along the cut line BB1 of FIG. 10. The second mandrel layer 330, the first mask layer 320 and the first mandrel layer 310 are etched in sequence along the second grooves 455 by taking the second pattern layer 450 as the mask to form the first trenches 355 running through the second mandrel layer 330, the first mask layer 320 and the first mandrel layer 310. The side walls of the first trenches 355 expose the second mandrel layer 330 in the openings 321.

In some implementations, the second mandrel layer 330, the first mask layer 320 and the first mandrel layer 310 are etched in sequence by the dry etching process. For example, the anisotropic dry etching process is used. The anisotropic dry etching process has anisotropic etching characteristics, which is conductive to improving the morphological quality of the first trenches 355, so that the dimensions and formation positions of the first trenches 355 may meet the process requirements. Furthermore, selection of appropriate etching gas and parameters may etch the second mandrel layer 330, the first mask layer 320 and the first mandrel layer 310 easily in the same etching chamber in sequence, and the etching process is simple. In addition, by the use of the dry etching process, an etching stop position is easy to control, so as to reduce the damage to the third mask layer 220.

It should be noted that before the second mandrel layer 330, the first mask layer 320 and the first mandrel layer 310 are etched, the method further includes that: the second anti-reflection coating layer 440 and the second planarization layer 430 are etched in sequence. After the first trenches 335 are formed, the method further includes that: the second pattern layer 450, the second anti-reflection coating layer 440 and the second planarization layer 430 are removed.

Figure 12:
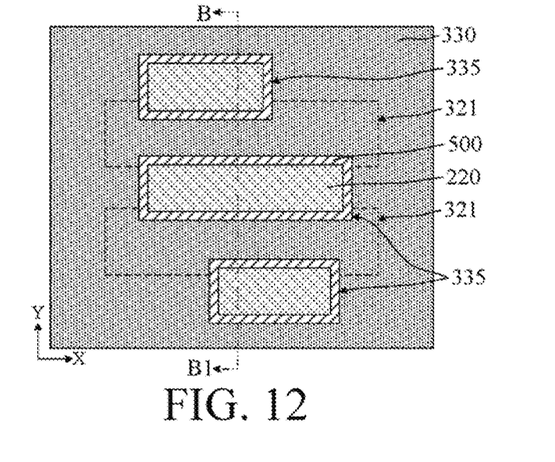
Figure 13:
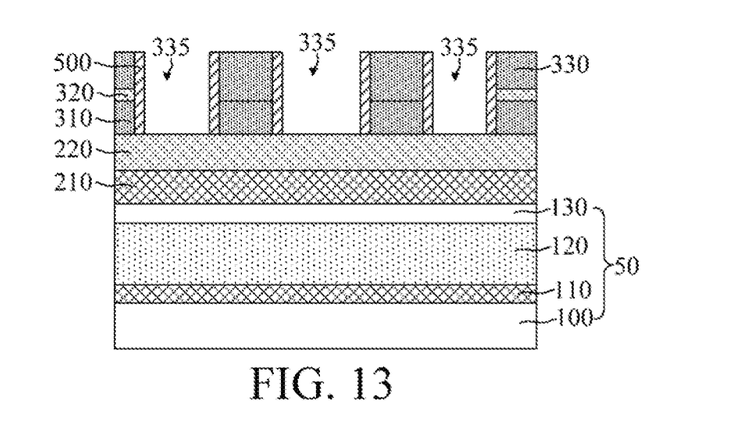

Referring to FIG. 12 and FIG. 13, FIG. 12 is a top view based on FIG. 10, and FIG. 13 is a cross-sectional view along the cut line BB1 of FIG. 12. The side wall layers 500 are formed on the side walls of the first trenches 335. For ease of illustration, the dotted frames in FIG. 12 are configured to indicate the outlines of the openings 321.

The second mandrel layer 330 and the first mandrel layer 310 below the positions of the openings 321 are subsequently etched to be removed to form the second trenches running through the first mandrel layer 310. The second trenches and the first trenches 335 are isolated through the side wall layers 500, so as to prevent the problem of connection between the second trenches and the first trenches 335, and distances between adjacent second trenches and first trenches 335 satisfy a designed minimum space. In addition, when the patterns of the second trenches and the first trenches 335 are subsequently transferred into the third mask layer 220, the side wall layers 500 are also used as the masks for etching the third mask layer 220.

For this reason, the material of the side wall layers 500 is different from the material of the second mandrel layer 330, the material of the first mandrel layer 310, and the material of the third mask layer 220. The material of the side wall layers 500 may be silicon oxide, silicon nitride, silicon oxynitride, or silicon carbide. In some implementations, the materials of the second mandrel layer 330 and the first mandrel layer 310 are both amorphous silicon, and the material of the third mask layer 220 is silicon oxide. Therefore, the material of the side wall layers 500 is silicon nitride. When the second mandrel layer 330 and the first mandrel layer 310 below the positions of the openings 321 are subsequently removed, the amorphous silicon and the silicon nitride have a high etching selection ratio. When the first mask layer 320 is subsequently removed, the silicon oxide and the silicon nitride also have a high etching selection ratio.

Specifically, the step that the side wall layers 500 are formed includes that: side wall films (not shown) are formed, wherein the side wall films conformally cover the bottom portions and side walls of the first trenches 335 and the top portion of the second mandrel layer 330; and the side wall films at the bottom portions of the first trenches 335 and the top portion of the second mandrel layer 330 are removed, and the side wall films on the side walls of the first trenches 335 are retained as the side wall layers 500.

In some implementations, the side wall films are formed by using the atomic layer deposition process. The thickness uniformity of the side wall films formed by the atomic layer deposition process is good, and the side wall films have high step coverage capacity, so that the side wall films may well cover the bottom corners of the first trenches 335.

In some implementations, the side wall films at the bottom portions of the first trenches 335 and the top portion of the second mandrel layer 330 are removed by using a maskless etching process. Specifically, the maskless etching process is anisotropic dry etching, so that the side wall films at the bottom portions of the first trenches 335 and the top portion of the second mandrel layer 330 may be removed in a direction perpendicular to the surface of the base 50, and the side wall films on the side walls of the first trenches 335 are retained. After the second mandrel layer 330 and the first mandrel layer 310 below the positions of the openings 321 are subsequently etched to be removed to form the second trenches running through the first mandrel layer 310, the side wall layers 500 in some regions will be independently used as the masks for etching the third mask layer 220, and the side wall layers 500 in other regions and the first mandrel layer 310 are jointly used as masks for etching the third mask layer 220.

Since the side wall layers 500 are formed using the maskless etching process, the width range of the side wall layers 500 is not affected by the photolithography process, and the width of the side wall layers 500 may be made to be very small, so that the distances between the adjacent second trenches and first trenches 335 satisfy the designed minimum space, and the side wall layers 500 still have good position accuracy and morphological accuracy to avoid the problem of an alignment error caused by the prior photolithography process. The widths of the side wall layers 500 are reasonably set according to a target space value between the adjacent second trenches and first trenches 335. In some implementations, the widths of the side wall layers 500 are 100 Å to 300 Å, such as 150 Å, 200 Å and 250 Å.

Figure 14:
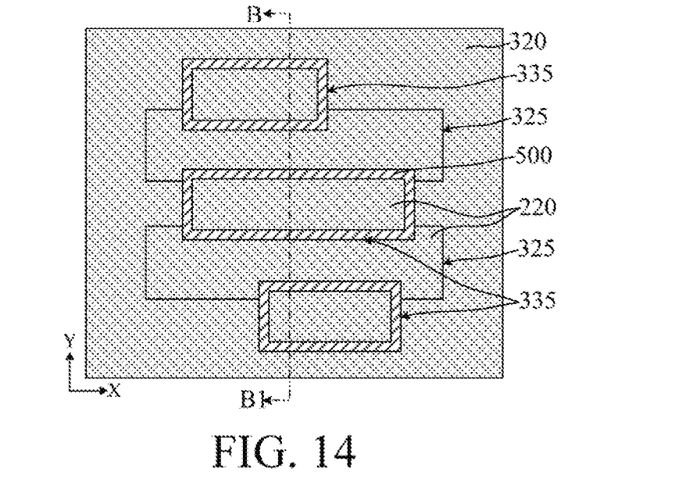
Figure 15:
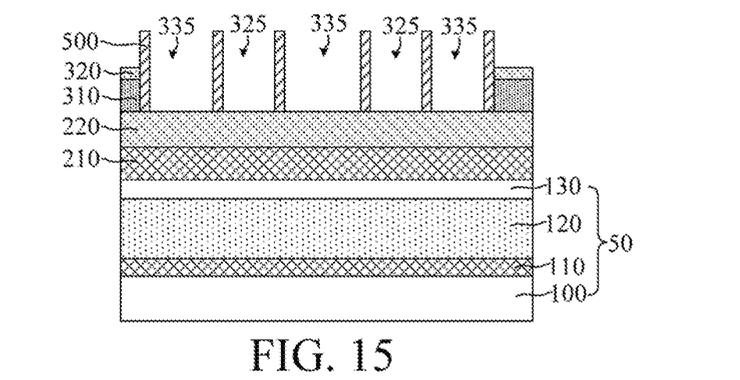

Referring to FIG. 14 and FIG. 15, FIG. 14 is a top view based on FIG. 12, and FIG. 15 is a cross-sectional view along the cut line BB1 of FIG. 14. The second mandrel layer 330 (as shown in FIG. 13) and the first mandrel layer 310 below the positions of the openings 321 are etched to be removed by taking the side wall layers 500 as the masks to form the second trenches 325 running through the first mandrel layer 310. The second trenches 325 and the first trenches 335 are isolated by the side wall layers 500.

The second trenches 325 are configured to define part of to-be-etched regions in the third mask layer 220. The first trenches 335 and the second trenches 325 are formed in some implementations, respectively, which is conductive to improving the process window for forming the first trenches 335 and the second trenches 325 (for example, improving the optical proximity effect or relieving the limitation to the resolution of the photolithography process), so that the pattern accuracy of the first trenches 335 and the second trenches 325 is guaranteed, thereby improving the accuracy of the pattern transfer.

In some implementations, when the second mandrel layer 330 and the first mandrel layer 310 below the positions of the openings 321 are etched to be removed, the etching rate of the second mandrel layer 330 is greater than that of the side wall layers 500, and the etching rate of the first mandrel layer 310 is greater than that of the side wall layers 500, so that the side wall layers 500 function as etching masks.

In some implementations, when the second mandrel layer 330 and the first mandrel layer 310 below the positions of the openings 321 are etched to be removed, the etching rate of the second mandrel layer 330 is greater than that of the first mask layer 320, and the etching rate of the first mandrel layer 310 is greater than that of the first mask layer 320. Under the protective effect of the first mask layer 320, the first mandrel layer 310 below the first mask layer 320 is retained, thereby forming the second trenches 325. Under the protective effect of the first mask layer 320, the process window for forming the second trenches 325 is enlarged, thereby enlarging the process window for the pattern transfer and then improving the accuracy of the pattern transfer.

In some implementations, the second mandrel layer 330 and the first mandrel layer 310 below the positions of the openings 321 are etched to be removed by using the maskless layer etching process. Therefore, the formation process of the second trenches 325 is not affected by the photolithography process, which significantly enlarges the process window for forming the second trenches 325. The first mandrel layer 310 covered by the first mask layer 320 will not be removed. Therefore, the openings 321 (shown in FIG. 4) formed in the first mask layer 320 and the side wall layers 500 define the shapes, dimensions and positions of the second trenches 325.

In some implementations, the second mandrel layer 330 and the first mandrel layer 310 below the positions of the openings 321 are etched to be removed by using the wet etching process. The wet etching process removes the second mandrel layer 330 and the first mandrel layer 310 through a chemical reaction method, which is conductive to reducing the damage to the film layer (e.g., the third mask layer 220) exposed by the first trenches 335. In addition, by using the wet etching process, it is easy to achieve a high etching selection ratio between the various film layers.

The side wall layers 500 are formed on the side walls of the first trenches 335, and cover the side wall of the first mandrel layer 310. The first mask layer 320 covers the top portion of part of the first mandrel layer 310. Therefore, the side wall layers 500 and the first mask layers 320 cover the first mandrel layer 310 in some regions, thereby playing a role of protecting the first mandrel layer 310 covered by the side wall layers 500 and the first mask layer 320, and significantly reducing the loss of the first mandrel layer 310 covered by the side wall layers 500 and the first mask layer 320 by the wet etching process. Moreover, the side wall layers 500 realize the isolation of the second trenches 325 from the first trenches 335.

Figure 16:
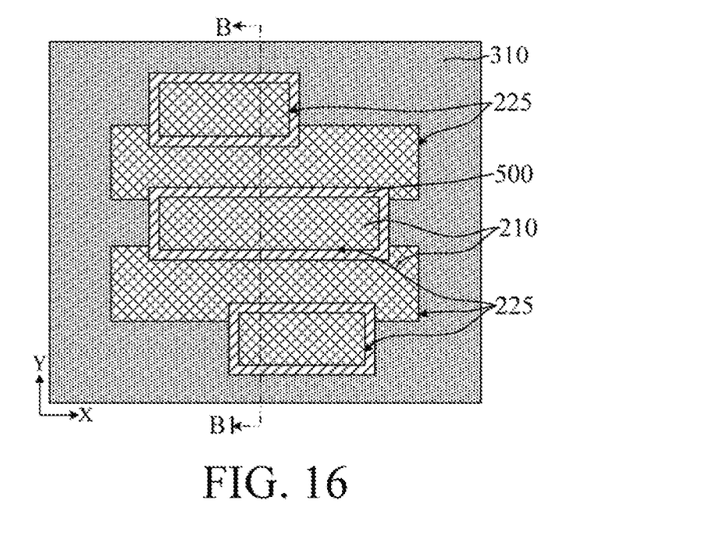
Figure 17:
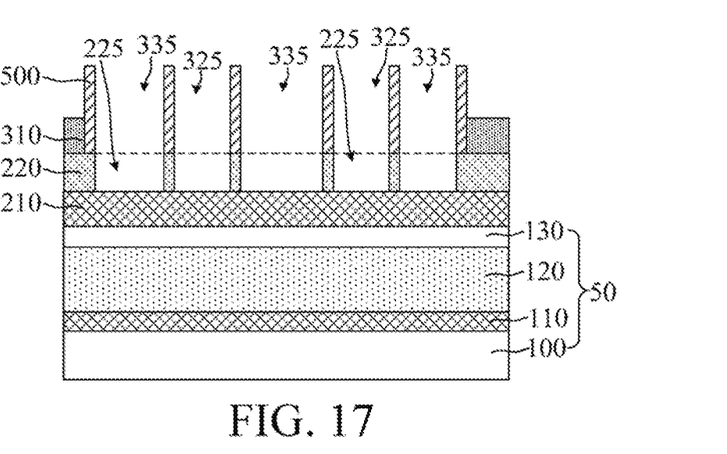

Referring to FIG. 16 and FIG. 17, FIG. 16 is a top view based on FIG. 14, and FIG. 17 is a cross-sectional view along the BB1 cut line of FIG. 16. After the second trenches 325 are formed, the method further includes that: the third mask layer 220 at the bottom portions of the first trenches 335 and the second trenches 325 are etched by taking the side wall layers 500 and the first mandrel layer 310 as the masks to form first mask openings 225 in the third mask layer 220.

For ease of illustration, the spaces in which the first mask openings 225 are located are indicated by dotted lines in FIG. 17.

The first mask openings 225 are configured to define the shapes, dimensions and positions of the interconnection openings formed in the dielectric layer 120. In some implementations, the third mask layer 220 at the bottom portions of the first trenches 335 and the second trenches 325 are etched by the dry etching process. For example, the anisotropic dry etching process is used.

It should be noted that the materials of the third mask layer 220 and the first mask layer 320 (as shown in FIG. 15) are the same. In the process that the third mask layer 220 is etched, the first mask layer 320 is correspondingly removed. Therefore, the subsequent step that the first mask layer 320 is removed is not needed.

After the first mask openings 225 are formed, the side wall layers 500 and the first mandrel layer 310 are removed. In some implementations, the side wall layers 500 and the first mandrel layer 310 are removed by using the wet etching process, so that the side wall layers 500 and the first mandrel layer 310 are easily removed clearly. The material of the side wall layers 500 is the silicon nitride. When the side wall layers 500 are removed, an etching solution used in the wet etching process is a phosphoric acid solution. The material of the first mandrel layer 310 is the amorphous silicon, and an etching solution used in the wet etching process is a mixed solution of $Cl_2$ and HBr or a TMAH solution.

Figure 18:
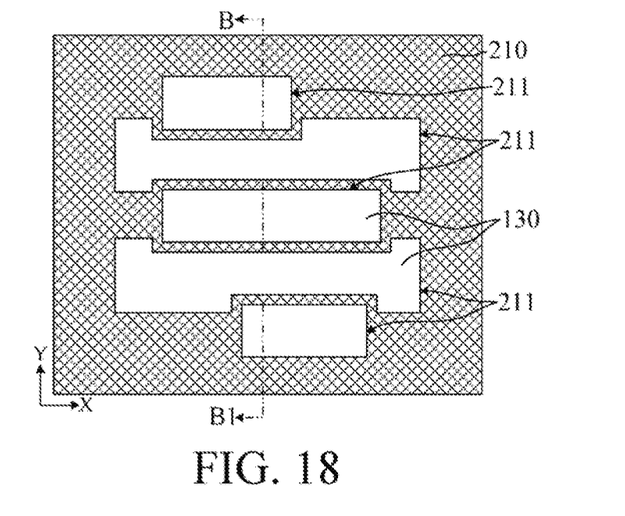
Figure 19:
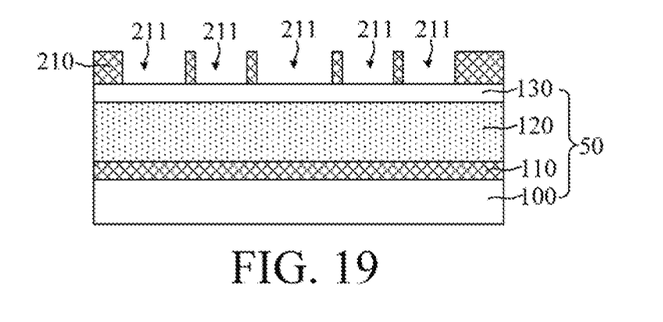

Referring to FIG. 18 and FIG. 19, FIG. 18 is a top view based on FIG. 16, and FIG. 19 is a cross-sectional view along the cut line BB1 of FIG. 18. The second mask layer 210 at the bottom portions of the first mask openings 225 (as shown in FIG. 17) is etched by taking the third mask layer 220 as a mask to form second mask openings 211 in the second mask layer 210.

The patterned second mask layer 210 is used as a mask for subsequently etching the dielectric layer 120. In some implementations, the second mask layer 210 is etched by using the dry etching process (such as the anisotropic dry etching process).

Figure 20:
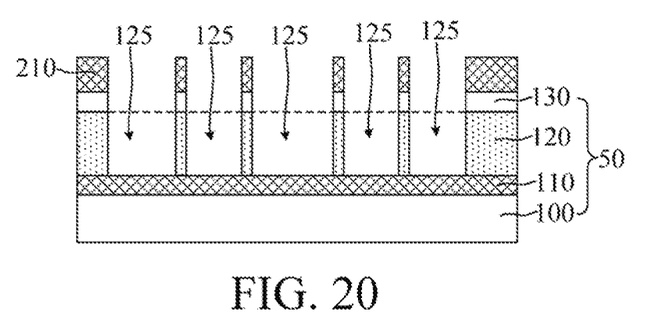

Referring to FIG. 20, FIG. 20 is a cross-sectional diagram based on FIG. 19. The dielectric layer 120 at the bottom portions of the first trenches 335 and the second trenches 325 are etched to form the interconnection openings 125 in the dielectric layer 120.

For ease of illustration, the spaces in which the interconnection openings 125 are located are indicated by dotted lines in FIG. 20.

The patterns of the second trenches 325 (as shown in FIG. 16) and the patterns of the first trenches 335 (as shown in FIG. 16) are transferred into the dielectric layer 120 to form the interconnection openings 125. It can be seen from the foregoing analysis that through the formation of the first mask layer 320 (as shown in FIG. 15), the process window for forming the second trenches 325 is enlarged, which correspondingly improves the pattern accuracy of the second trenches 325 and thus improves the pattern accuracy of the interconnection openings 125.

Specifically, the protective layer 130 and the dielectric layer 120 are etched along the second mask openings 211 by taking the patterned second mask layer 210 as a mask, so as to expose the surface of the etching stop layer 110. Then, the etching stop layer 110 is etched till the surfaces of the conductive structures (not shown) in the substrate 100 are exposed. In some implementations, the etching is performed by using the dry etching process to form the interconnection openings 125.

In some implementations, after the interconnection openings 125 are formed, the method further includes that: the second mask layer 210 is removed.

Figure 21:
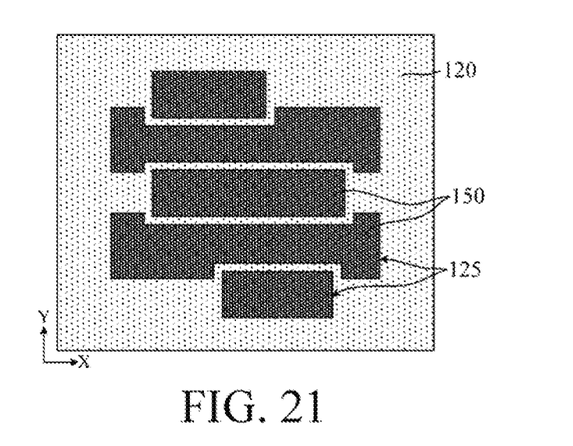

Referring to FIG. 21, FIG. 21 is a top view based on FIG. 20, and the interconnection openings 125 are filled with the conductive materials to form interconnection structures 150.

The pattern accuracy of the interconnection openings 125 is high, so that the morphology and layout of the interconnection structures 150 meet the design requirements and are contributive to improving the performance of the interconnection structures 150. In some implementations, the interconnection structures 150 are metal interconnection lines in a BEOL process, and the interconnection structures 150 are electrically connected to the conductive structures (not shown). The process that the interconnection structures 150 are formed generally includes a step that the conductive materials are planarized, and the protective layer 130 is removed during the planarization.

Figure 22:
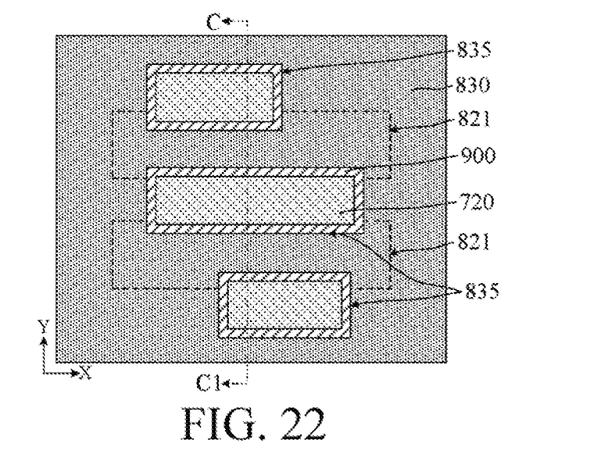
FIG. 22 to FIG. 23 are schematic structural diagrams of one form of a semiconductor structure.
Figure 23:
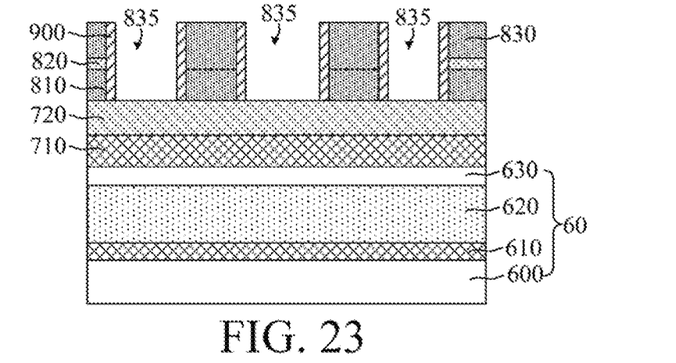

Embodiments and implementations of the present disclosure further provide a semiconductor structure. Referring to FIG. 22 and FIG. 23, a schematic structural diagram of one form of a semiconductor structure is illustrated. FIG. 22 is a top view, and FIG. 23 is a cross-sectional diagram along a cut line CC1 of the FIG. 22. For ease of illustration, the dotted frames in FIG. 22 are configured to indicate the outlines of openings.

The semiconductor structure includes: a base 60; a first mandrel layer 810, located on the base 60; a first mask layer 820, located on the first mandrel layer 810, wherein the first mask layer 820 has openings 821 (as shown in FIG. 22) running through the first mask layer 820; a second mandrel layer 830, covering the first mask layer 820 and filling the openings 821; first trenches 835, running through the second mandrel layer 830, the first mask layer 820 and the first mandrel layer 821; and side wall layers 900, located on side walls of the first trenches 835 and covering a side wall, facing the first trenches 835, of the second mandrel layer 830 in the openings 821.

In some implementations, the base 60 includes a substrate 600 and a dielectric layer 620 located on the substrate 600. A plurality of conductive structures (not shown) is formed in the substrate 600. The dielectric layer 620 is configured to form interconnection openings to realize electric isolation between interconnection structures in a BEOL process. A material of the dielectric layer 620 is a low-k dielectric material or an ultra-low-k dielectric material. For this reason, the base 60 further includes a protective layer 630 located on the surface of the dielectric layer 620. The protective layer 630 is configured to protect the dielectric layer 620. In some implementations, a material of the protective layer 130 is silicon oxide.

The base 60 further includes an etching stop layer 610 located between the substrate 600 and the dielectric layer 620. A material of the etching stop layer 610 is different from that of the dielectric layer 620. The material of the etching stop layer 610 may be SiCN, SiC, SiN or BN.

The first mandrel layer 810 and the second mandrel layer 830 are both configured to provide a support to the side wall layers 900. In some implementations, a material of the first mandrel layer 810 is amorphous silicon, and a material of the second mandrel layer 830 is amorphous silicon. In other implementations, the material of the first mandrel layer may also be amorphous carbon, and the material of the second mandrel layer may also be the amorphous carbon.

The first trenches 835 run through the second mandrel layer 830, the first mask layer 820 and the first mandrel layer 810. By making the second mandrel layer 830 and the first mandrel layer 810 have the same material, when the first trenches 835 are formed, it is convenient to etch the second mandrel layer 330 and the first mandrel layer 310 using the same process conditions, which is conductive to reducing the complexity of the process.

The first mask layer 820 is configured to protect the first mandrel layer 810. Specifically, the openings 821 for exposing the first mandrel layer 310 are formed in the first mask layer 820. The first mandrel layer 310 and the second mandrel layer 330 are in contact with each other at the positions of the openings 821. The first mask layer 820 is located between the second mandrel layer 330 and part of the first mandrel layer 310 at other positions. Under the protective effect of the first mask layer 820, the second mandrel layer 830 and the first mandrel layer 810 below the positions of the openings 821 may be subsequently removed, and the first mandrel layer 810 below the first mask layer 820 is retained, so as to form second trenches, and the second trenches and the first trenches 835 are isolated by the side wall layers 900. Under the protective effect of the first mask layer 820, a process window for forming the second trenches is enlarged, which is conductive to improving the accuracy of pattern transfer.

For this reason, the material of the first mask layer 820 is different from the material of the first mandrel layer 810, and the material of the first mask layer 320 is different from the material of the second mandrel layer 330. The material of the first mask layer 320 may be silicon oxide, silicon nitride, silicon oxynitride, or silicon carbonitride. In the process of etching the first mandrel layer 810, the material of the first mandrel layer 810 and the material of the first mask layer 720 have a high etching selection ratio. In the process of etching the second mandrel layer 830, the material of the second mandrel layer 830 and the material of the first mask layer 720 have a high etching selection ratio, so that the protective effect of the first mask layer 320 on the first mandrel layer 310 is ensured. In some implementations, the material of the first mask layer 820 is silicon oxide.

The thickness of the first mask layer 820 should not be too small or too large. If the thickness of the first mask layer 820 is too small, the first mask layer 820 is easily removed prematurely in the etching process of forming the second trenches, thereby reducing the accuracy of the pattern transfer. If the thickness of the first mask layer 820 is too large, the difficulty of the processes of the etching of the first mask layer 820 and the removal of the first mask layer 820 will be correspondingly increased. In some implementations, the thickness of the first mask layer 820 is 100 Å to 1000 Å, for example, 300 Å, 500 Å, 700 521 , and 900 Å.

In some implementations, in order to improve the accuracy of the pattern transfer and thus improve the morphology of the interconnection openings subsequently formed in the dielectric layer 620, the semiconductor structure further includes: a second mask layer 710 located between the base 60 and the first mandrel layer 810; and a third mask layer 720, located between the second mask layer 710 and the first mandrel layer 810. The etching resistance of the second mask layer 710 is greater than that of the third mask layer 720.

When the third mask layer 720 is subsequently etched, the second mask layer 710 functions as the etching stop layer, thereby improving the process window and contour control of the etching process. A material of the second mask layer 710 is a nitrogen-containing dielectric material, thereby enhancing the etching resistance of the second mask layer 710. In some implementations, the material of the second mask layer 710 is silicon nitride.

The third mask layer 720 is used as a mask for patterning the base 60. By patterning the third mask layer 720 later, a pattern in the third mask layer 720 is further transferred into the second mask layer 710, and then is transferred into the base 60 through the patterned second mask layer 710. In some implementations, the material of the third mask layer 720 is silicon oxide. The silicon oxide and the silicon nitride have a high etching selection ratio, and the amorphous silicon and the silicon oxide also have a high etching selection ratio. The materials of the first mask layer 820 and the third mask layer 720 are the same. After the second trenches are subsequently formed, the third mask layer 720 at the bottom portions of the first trenches 835 and the second trenches will also be etched. When the third mask layer 720 is etched, the first mask layer 820 is exposed to an etching environment, so that the first mask layer 820 may be removed in the process of etching the third mask layer 720, and the step that the first mask layer 820 is removed is correspondingly omitted, which simplifies the process steps.

The openings 821 are configured to define the positions, shapes and dimensions of the second trenches, so as to define the shapes, positions and dimensions of the interconnection openings in the dielectric layer 620. In some implementations, an extending direction of each opening 821 is a first direction (as shown in an X direction in FIG. 22), and a direction perpendicular to the first direction is a second direction (as shown in a Y direction in FIG. 22). A plurality of openings 821 is provided, and is arranged in parallel in the second direction.

The first trenches 835 are configured to define part of to-be-etched regions in the third mask layer 720, thereby defining the shapes, positions and dimensions of the interconnection openings in the dielectric layer 620. In addition, the first trenches 835 are also configured to provide spaces for the formation of the side wall layers 900. In some implementations, in the second direction, projections of the first trenches 835 and the projections of the openings 821 on the base 60 partially overlap each other, thus reducing distances between adjacent first trenches 835 and second trenches and meeting the requirement of the design complexity of an IC. In other implementations, the projections of the first trenches and the projections of the openings on the base are adjacent according to the design requirements of the IC.

The side wall layers 900 are configured to realize the isolation of the second trenches from the first trenches 835, so as to prevent the problem of connection between the second trenches and the first trenches 835. In addition, the distances between the adjacent second trenches and first trenches 835 meet the designed minimum space. In addition, when the patterns of the second trenches and the first trenches 835 are subsequently transferred into the third mask layer 720, the side wall layers 900 are also used as masks for etching the third mask layer 720.

For this reason, the material of the side wall layers 900 is different from the material of the second mandrel layer 830, the material of the first mandrel layer 810, and the material of the third mask layer 820. The material of the side wall layers 900 may be silicon nitride, silicon oxide, silicon oxynitride, or silicon carbide. In some implementations, the materials of the second mandrel layer 830 and the first mandrel layer 810 are both amorphous silicon, and the material of the third mask layer 820 is silicon oxide. Therefore, the material of the side wall layers 900 is silicon nitride. When the second mandrel layer 330 and the first mandrel layer 310 below the positions of the openings 321 are subsequently removed, the amorphous silicon and the silicon nitride have a high etching selection ratio. When the first mask layer 320 is subsequently removed, the silicon oxide and the silicon nitride also have a high etching selection ratio.

The semiconductor structure may be formed by the formation method according to the foregoing embodiments and implementations, or may also be formed by other formation methods. For a detailed description of some forms of the semiconductor structure, reference may be made to the corresponding description in the foregoing embodiments and implementations, as the descriptions are omitted here in the present embodiments and implementations.

Although the present disclosure has been disclosed above, the present disclosure is not limited thereto. A person skilled in the art may make variations and modifications without departing from the spirit and scope of the present disclosure. Therefore, the protection scope of the present disclosure should be subject to the appended claims.

What is claimed is:

1. A formation method of a semiconductor structure, comprising:
    providing a base, wherein a first mandrel layer and a first mask layer located on the first mandrel layer are formed on the base, and openings exposing the first mandrel layer are formed in the first mask layer;
    forming a second mandrel layer covering the first mask layer, wherein the second mandrel layer also fills the openings;
    forming first trenches running through the second mandrel layer, the first mask layer and the first mandrel layer, wherein the side walls of the first trenches expose the second mandrel layer in the openings; forming side wall layers on the side walls of the first trenches; and
    etching to remove the second mandrel layer and the first mandrel layer below the openings by taking the side wall layers as masks to form second trenches running through the first mandrel layer, wherein the second trenches and the first trenches are isolated by the side wall layers.

2. The formation method of the semiconductor structure according to claim 1, wherein:
    a second mask layer and a third mask layer located on the second mask layer are further formed between the base and the first mandrel layer, and the etching resistance of the second mask layer is greater than that of the third mask layer; and
    after forming the second trenches, the formation method of the semiconductor structure further comprises:
        etching the third mask layer at bottom portions of the first trenches and the second trenches by taking the side wall layers and the first mandrel layer as masks to form first mask openings in the third mask layer;
        after forming the first mask openings, removing the side wall layers and the first mandrel layer; and
        after removing the side wall layers and the first mandrel layer, etching the second mask layer at bottom portions of the first mask openings by taking the third mask layer as a mask to form second mask openings in the second mask layer.

3. The formation method of the semiconductor structure according to claim 1, wherein a step of forming the openings exposing the first mandrel layer in the first mask layer comprises:
    forming a first pattern layer on the first mask layer, wherein first grooves are formed in the first pattern layer; etching the first mask layer along the first grooves by taking the first pattern layer as a mask; and
    removing the first pattern layer.

4. The formation method of the semiconductor structure according to claim 1, wherein:
    an extending direction of each opening of the openings is a first direction, and a direction perpendicular to the first direction is a second direction;
    the step of forming the first trenches comprises: forming a second pattern layer on the second mandrel layer, wherein second grooves are formed in the second pattern layer, the second grooves extend in the first direction, and in the second direction, and projections of the second grooves and projections of the openings on the base are adjacent to each other or partially overlap each other;
    etching the second mandrel layer, the first mask layer and the first mandrel layer in sequence along the second grooves by taking the second pattern layer as a mask; and
    removing the second pattern layer.

5. The formation method of the semiconductor structure according to claim 1, wherein:
    a material of the first mandrel layer is amorphous silicon or amorphous carbon;
    a material of the second mandrel layer is amorphous silicon or amorphous carbon; and
    a material of the first mask layer is silicon oxide, silicon nitride, silicon oxynitride, or silicon carbonitride.

6. The formation method of the semiconductor structure according to claim 2, wherein the materials of the first mask layer and the third mask layer are the same.

7. The formation method of the semiconductor structure according to claim 1, wherein in a step of forming the first mask layer, the thickness of the first mask layer is 100 Å to 1000 Å.

8. The formation method of the semiconductor structure according to claim 1, wherein the first mask layer is etched using a dry etching process to form the openings.

9. The formation method of the semiconductor structure according to claim 1, wherein the second mandrel layer, the first mask layer, and the first mandrel layer are etched using a dry etching process to form the first trenches.

10. The formation method of the semiconductor structure according to claim 1, wherein the second mandrel layer and the first mandrel layer below the positions of the openings are etched to be removed using a wet etching process.

11. The formation method of the semiconductor structure according to claim 1, wherein the second mandrel layer is formed using a chemical vapor deposition process.

12. The formation method of the semiconductor structure according to claim 2, wherein:
    the base comprises a substrate and a dielectric layer located on the substrate; and the formation method further comprises:
        etching the dielectric layer at the bottom portions of the first trenches and the second trenches to form interconnection openings in the dielectric layer; and
        filling the interconnection openings to form interconnection structures.

* * * * *